(12) United States Patent
Liu et al.

(10) Patent No.: US 6,486,564 B2
(45) Date of Patent: Nov. 26, 2002

(54) HEAT DISSIPATION MODULE FOR A BGA IC

(75) Inventors: Wen-Chun Liu, Pingtung (TW); Yi-Hsiang Pan, Feng-Shan (TW); Kuo-Yuan Lee, Kaohsiung (TW)

(73) Assignee: Walsin Advanced Electronics Ltd., Kaohsiung (TW)

( * ) Notice: Subject to any disclaimer, the term of this patent is extended or adjusted under 35 U.S.C. 154(b) by 0 days.

(21) Appl. No.: 09/931,086

(22) Filed: Aug. 15, 2001

(65) Prior Publication Data

US 2002/0020926 A1 Feb. 21, 2002

(30) Foreign Application Priority Data

Aug. 17, 2000 (TW) ...................................... 89214238 U

(51) Int. Cl.⁷ ............................................... H01L 23/28
(52) U.S. Cl. ....................... 257/796; 257/687; 257/706; 257/710; 257/712; 257/787
(58) Field of Search ................................ 257/687, 706, 257/710, 712, 787, 796

(56) References Cited

U.S. PATENT DOCUMENTS

| 5,289,039 A | * | 2/1994 | Ishida et al. | 257/675 |
| 6,229,702 B1 | * | 5/2001 | Tao et al. | 165/80.2 |
| 6,246,115 B1 | * | 6/2001 | Tang et al. | 257/675 |

FOREIGN PATENT DOCUMENTS

| JP | 697321 A | * | 4/1994 | 257/796 |
| JP | 697326 A | * | 4/1994 | 257/796 |

* cited by examiner

*Primary Examiner*—Eddie Lee
*Assistant Examiner*—Matthew E. Warren
(74) *Attorney, Agent, or Firm*—Dellett and Walters

(57) ABSTRACT

An improved heat dissipation module for BGA IC's is a thin metal module used for heat dissipation in an encapsulated IC device. It has an annular base with several supports extending from its inner rim upwards to support a top plate. At least one protruding annular ring is provided on the top surface of the top plate. This design can ensure the top plate and a mold match during the capsulation process, avoid the glue overflow problem, and increase its total dissipation area to facilitate heat dissipation.

19 Claims, 3 Drawing Sheets

HEAT DISSIPATION MODULE FOR A BGA IC

BACKGROUND OF THE INVENTION

1. Field of Invention

The invention relates to an improve structure of a heat dissipation module for BGA (Ball Grid Array) IC (Integrated Circuit) devices, and more specifically to a metal heart dissipation module design for circuit chips encapsulated in an IC device.

2. Related Art

The BGA IC device is a new generation of semiconductor device that has a small volume and many pins. It is made by mounting a cut chip on a substrate with each I/O connecting point of the chip forming electrical communications with the corresponding circuits on the substrate, followed by glue encapsulation and implanting arrayed tin balls on the bottom surface of the substrate. The arrayed tin balls implanted on the bottom of device replace conventional pins. They are formed at designated locations on a circuit board using surface mount technology.

The chip in the foregoing IC device produces a high temperature during operation. The high temperature has to be controlled so that the chip can function normally. In addition to mixing metal materials that help heat conduction into the glue material, another design, shown in FIG. 4, encapsulates a metal heat dissipation module 7, a chip 8, and a substrate 80 in glue 82. The heat dissipation module 7 has an annular base 70 installed on the substrate 80 and over the chip 8. Several supports 71 extending upward from the inner rim of the annular base 70 support a top plate 72 that is higher than wires 81 connecting the I/O connecting points on the chip 8 to those on the substrate 80. The top plate 72 is outside the glue 82 after encapsulation so that the heat produced by the operating chip 8 can be quickly released to the atmosphere through the large area top plate 72 and good heat conductivity of the metal heat dissipation module 7.

Even though the heat dissipation module 7 can provide heat conduction and dissipation for the chip 8, it is hard to make the top plate 72 of the heat dissipation module 7 totally flat as required. Therefore, the module cannot nicely match the mold. Even if the top plate 72 can be made to be exactly flat, it will also deform due to the high temperature. Thus, when the heat dissipation module 7 and the substrate 80 with the chip 8 mounted on the substrate 80 are encapsulated in the mold 83, the glue 82 is likely to flow onto the outer surface of the top plate 72, producing so-called glue overflow. This results in bad appearance of the device. If the length or area of the overflown glue exceeds an allowed range, an additional cleaning procedure is needed. This will increase machining costs and difficulty in manufacturing.

Furthermore, since the top plate 72 of the heat dissipation module 7 is simply flat, as shown in FIG. 5, the total contact surface between the top plate 72 and the air is not a very large area. Thus, the heat dissipation effect is limited.

SUMMARY OF THE INVENTION

In view of the drawbacks in the foregoing heat dissipation module for IC devices, the heat dissipation module in accordance with the present invention provides an improved structure for heat dissipation modules for BGA IC devices. The top plate dissipation can match with the mold better, thereby reducing the problem of thermal expansion. It can fully solve the glue overflow problem during encapsulation and ensures that each finished product satisfies the standards, avoiding the need for a second machining. The design can also increase the heat dissipation area for better heat dissipation.

To achieve the foregoing objective, the main technique disclosed herein is that the heat dissipation module has an annular base whose inner rim is greater than the area needed for connection between the chip and the substrate. Several supports extend from the inner rim of the annular base upwards to support a top plate. The top plate is higher than the highest point of the electrical connection between the chip and the substrate. By extending at least one protruding ring on the top surface of the top plate, the heat dissipation module can match the mold better during encapsulation, thereby avoiding the glue overflow problem and increasing the total area for heat dissipation.

DETAILED DESCRIPTION OF THE INVENTION

Figure 1:
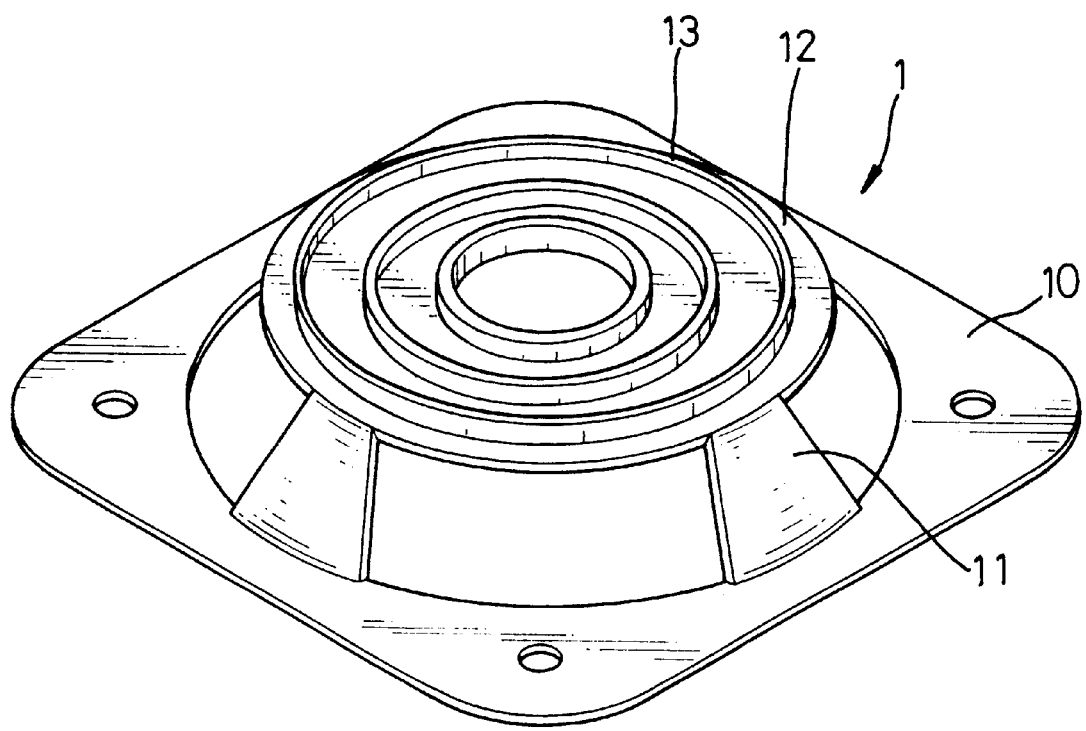
FIG. 1 is a perspective view of the heat dissipation module in accordance with the present invention.
Figure 2:
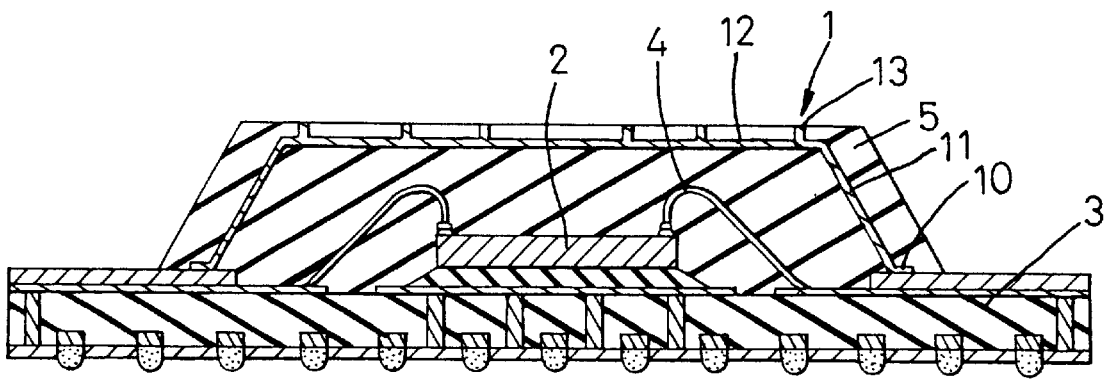
FIG. 2 is a cross-sectional side plan view of the heat dissipation module in FIG. 1 used with a BGA IC device.

With reference to FIGS. 1 and 2, the disclosed heat dissipation module can be used in glue capsulated BGA (Ball Grad Array) IC devices. The BGA IC device has wire connections between chip I/O connecting points and substrate connecting points and a chip mounted on the substrate. There can be a single chip on the substrate, a chip array on the substrate or several chips stacked on the substrate. The heat dissipation module 1 in accordance with the present invention has a base 10 with an annular or a rectangular frame shape. Its inner rim encloses the area of connections between the chip 2 and the substrate 3. If several chips are installed on the substrate, the inner rim of the base 10 encloses all the connections between the chips 2 and the substrate 3. Several supports 11 extend from the inner rim of the base 10 to support a top plate 12. The top plate 12 is higher than the highest point of the electrical connections between the chips 2 and the substrate 3. The chip 2 and the substrate 3 have wire bonding connections. The top plate 12 is then higher than the highest arc of the connecting wires 4 between the chip I/O connecting points and the substrate connecting points. If the chip 2 is connected to the substrate 3 by placing the chip I/O connecting points on the substrate side of the chip 2, then the top plate 12 is higher than the top of the chip 2. If several chips 2 are stacked on the substrate (not shown), then the top plate 12 is higher than the top of the highest chip 2 in the stack. The top plate 12 can be circular or rectangular. At least one protruding ring 13 is formed outward on the top surface of the top plate 12. During encapsulation, a portion of the top plate 12 inside the protruding ring 13 is separated from glue by the protruding ring 13. Therefore, the portion of the top plate 12 is exposed to the air without the need for a second machining to remove the overflow glue. Similarly, the protruding ring 13 can be a circular or rectangular ring. It is preferable to have more than two protruding rings 13.

During encapsulation, the hat dissipation module 1 is mounted on the substrate 3 to cover the chip 2 after the chip is mounted and bonded (or flipped). The top plate 12 of the heat dissipation module 1 is right on top of the chip 2. The protruding ring 13 is detachably mounted on the inner surface of the mold before filling the mold with glue. After the flue 5 cures, tin balls 30 are implanted on the bottom surface of the substrate 3, followed by cutting. This completes the encapsulation of the BGA IC device.

Figure 3:
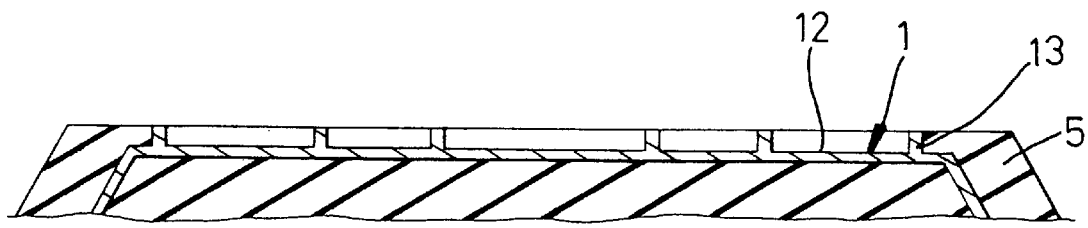
FIG. 3 is an enlarged cross sectional side plan view of the top plate of the heat dissipation module in FIG. 2.
Figure 4:
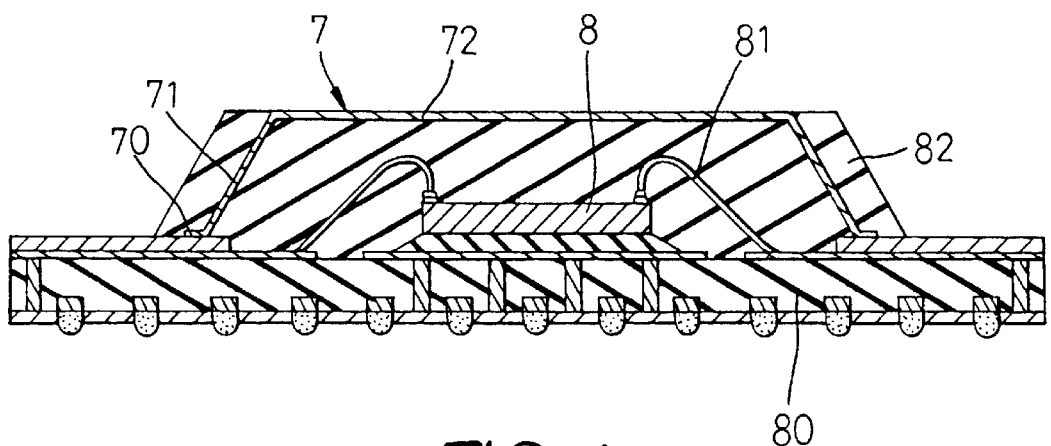
FIG. 4 is a cross-sectional side plan view of a conventional heat dissipation module used with a BGA IC device.
Figure 5:
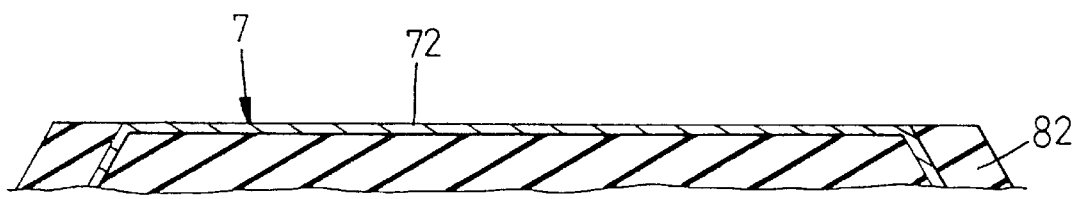
FIG. 5 is an enlarged cross sectional side plan view of the top plate of the conventional heat dissipation module in FIG. 4.

From the foregoing description, the heat dissipation module in accordance with the present invention has the following advantages:

1. It ensures the matching between the heat dissipation module and the mold. Since the protruding ring on the top plate of the heat dissipation module is detachably mounted in the inner surface of the mold during the encapsulation, there is less friction between the top plate and the mold. This not only reduces possible damage to the mold, but also effectively ensures the match between the top plate and the mold, reducing bad matching due to thermal expansion. It can also solve the problem of glue overflow. Therefore, each finished product will satisfy the required standards, without the need for a second machining to remove overflow glue.
2. It increases the heat dissipation ability. Since at least one protruding ring is formed on the top surface of the top plate, as shown in FIG. 3, the contact surface with the air has a larger area for facilitating heat dissipation.

The invention may be varied in many ways by a skilled person in the art. Such variations are not to be regarded as a departure from the spirit and scope of the invention, and all such modifications are intended to be included within the scope of the following claims.

What is claimed is:

1. A heat dissipation module for a BGA (Ball Grid Array) IC (Integrated Circuit) device encapsulated along with a chip and a substrate inside glue where electrical connections are made between the chip and the substrate in a connection area, the heat dissipation module comprising:

an annular base, whose inner rim covers the connection area for the chip and the substrate;

multiple supports, which extend from the inner rim of the annular base upwards;

a top plate, which is supported by the supports and is higher than the highest point of the electrical connections between the chip and the substrate; and at least one protruding ring, which is formed upward on top of the top plate to separate from the glue to expose to the air without the need for a second machining to remove a part of the glue on the top plate.

2. The heat dissipation module of claim 1, wherein the top plate is circular.

3. The heat dissipation module of claim 1, wherein the top plate is rectangular.

4. The heat dissipation module of claim 1, wherein at least two protruding rings are formed on the top plate.

5. The heat dissipation module of claim 4, wherein the protruding ring is circular.

6. The heat dissipation module of claim 4, wherein the protruding ring is rectangular.

7. The heat dissipation module of claim 1, wherein the protruding ring is circular.

8. The heat dissipation module of claim 1, wherein the protruding ring is rectangular.

9. The heat dissipation module of claim 1, wherein the heat dissipation module is used in an IC device that uses metal wire as electrical connections between the chip and the substrate.

10. The heat dissipation module of claim 9, wherein the hear dissipation module is used in an IC device with a single chip mounted on the substrate.

11. The heat dissipation module of claim 9, wherein the heat dissipation module is used in an IC device with a chip array mounted on the substrate.

12. The heat dissipation module of claim 9, wherein the heat dissipation module is used in an IC device with multiple stacked chips mounted on the substrate.

13. The heat dissipation module of claim 1, wherein the heat dissipation module is used in an IC device whose chip is mounted on the substrate by flipping.

14. The heat dissipation module of claim 13, wherein the heat dissipation module is used in an IC device with a single chip mounted on the substrate.

15. The heat dissipation module of claim 13, wherein the heat dissipation module is used in an IC device with a chip array mounted on the substrate.

16. The heat dissipation module of claim 13, wherein the heat dissipation module is used in an IC device with multiple chips mounted on the substrate.

17. The heat dissipation module of claim 1, wherein the heat dissipation module is used in an IC device with a single chip mounted on the substrate.

18. The heat dissipation module of claim 1, wherein the heat dissipation module is used in an IC device with a chip array mounted on the substrate.

19. The heat dissipation module of claim 1, wherein the heat dissipation module is used in an IC device with multiple stacked chips mounted on the substrate.

* * * * *